US012777796B2

(12) United States Patent
Youn et al.

(10) Patent No.: US 12,777,796 B2

(45) Date of Patent: Oct. 27, 2026

(54) DISPLAY DEVICE

(71) Applicant: LG Display Co., Ltd., Seoul (KR)

(72) Inventors: Jae Woong Youn, Paju-si (KR); Min Seon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 372 days.

(21) Appl. No.: 18/501,558

(22) Filed: Nov. 3, 2023

(65) Prior Publication Data

US 2024/0260358 A1 Aug. 1, 2024

(30) Foreign Application Priority Data

Jan. 30, 2023 (KR) ........................ 10-2023-0011716

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0819* (2013.01); *G09G 2300/0852* (2013.01)

(58) Field of Classification Search
CPC ........................... G09G 3/3233; H10K 59/131
See application file for complete search history.

(56) References Cited

U.S. PATENT DOCUMENTS

| | | | | |
|---|---|---|---|---|
| 10,782,573 | B2 * | 9/2020 | Park | G02F 1/13452 |
| 10,892,312 | B2 * | 1/2021 | Won | H10K 59/131 |
| 11,183,653 | B2 * | 11/2021 | Lee | H10K 59/40 |
| 2020/0119125 | A1 * | 4/2020 | Cho | H10D 86/481 |
| 2020/0403057 | A1 | 12/2020 | Kang et al. | |
| 2021/0193775 | A1 * | 6/2021 | Kang | G09G 3/3233 |
| 2022/0310763 | A1 | 9/2022 | Cho et al. | |

FOREIGN PATENT DOCUMENTS

| | | | |
|---|---|---|---|
| KR | 10-2019-0072060 | A | 6/2019 |
| KR | 10-2020-0145953 | A | 12/2020 |
| KR | 10-2022-0134839 | A | 10/2022 |

* cited by examiner

*Primary Examiner* — Dale E Page
*Assistant Examiner* — Wilner Jean Baptiste
(74) *Attorney, Agent, or Firm* — Seed Intellectual Property Law Group LLP

(57) ABSTRACT

A display device is provided. The display device includes a substrate, and data lines disposed to extend from a pad area to an active area defined on the substrate. The data lines are disposed to overlap in groups of at least three data lines in a link area defined between the pad area and the active area. The at least three data lines are disposed on different layers, respectively.

20 Claims, 12 Drawing Sheets

DISPLAY DEVICE

CROSS-REFERENCE TO RELATED APPLICATION(S)

This application claims the benefit of Korean Patent Application No. 10-2023-0011716 filed on Jan. 30, 2023, which is hereby incorporated by reference as if fully set forth herein.

BACKGROUND

Technical Field

The present disclosure relates to a display device and a driving method of the same.

Description of the Related Art

In accordance with advances in information technology, the market for a display device which is a connection medium between a user and information is expanding. Accordingly, use of a display device such as a light emitting display device (LED), a quantum dot display device (QDD), a liquid crystal display device (LCD), etc., is increasing.

The above-mentioned display devices include a display panel including subpixels, a driver configured to output a drive signal for driving of the display panel, a power supply configured to generate power to be supplied to the display panel or the driver, etc.

In such display devices, when drive signals, for example, a scan signal, a data signal, etc., are supplied to the subpixels formed at the display panel, selected ones of the subpixels transmit light therethrough or directly emit light and, as such, an image may be displayed.

BRIEF SUMMARY

Accordingly, the present disclosure is directed to a display device that substantially obviates one or more problems due to limitations and disadvantages of the related art.

An object of the present disclosure is to provide a display device configured to not only reduce or minimize an area occupied by a link area, thereby enabling a display panel to have a narrow bezel, but also to optionally minimize the possibility of generation of failure caused by an exposure difference at a pattern step, thereby achieving an enhancement in production yield.

Additional advantages, technical benefits, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these benefits and other advantages and in accordance with the purpose of the disclosure, as embodied and broadly described herein, a display device includes a substrate, and data lines disposed to extend from a pad area to an active area defined on the substrate, wherein the data lines are disposed to overlap in groups of at least three data lines in a link area defined between the pad area and the active area, and the at least three data lines are disposed on different layers, respectively.

A first one of the at least three data lines disposed on a lower layer may be formed using a light shielding metal layer disposed on the substrate.

A second one of the at least three data lines disposed on a middle layer may be formed using a first source/drain metal layer disposed on a lower insulating layer covering the light shielding metal layer.

A third one of the at least three data lines disposed on an upper layer may be formed using a second source/drain metal layer disposed on a middle insulating layer covering the first source/drain metal layer.

The first data line may have a greater line width than a line width of the second data line and/or a line width of the third data line.

A first routing area may be defined between the pad area and the link area, and a second routing area may be defined between the link area and the active area. A first contact hole included in the first routing area and a second contact hole included in the second routing area may be disposed to be vertically symmetrical with each other with reference to a virtual horizontal line present in the link area.

In another aspect of the present disclosure, there is provided a display device including a display panel, and data lines disposed on the display panel, wherein the data lines include data lines disposed in a zigzag form, and the zigzag data lines include at least three data lines disposed on different layers, respectively, while overlapping one another.

A first one of the at least three data lines disposed on a lower layer may be formed using a light shielding metal layer disposed on a substrate. A second one of the at least three data lines disposed on a middle layer may be formed using a first source/drain metal layer disposed on a lower insulating layer covering the light shielding metal layer. A third one of the at least three data lines disposed on an upper layer may be formed using a second source/drain metal layer disposed on a middle insulating layer covering the first source/drain metal layer.

The first data line may have a greater line width than a line width of the second data line and/or a line width of the third data line.

The at least three data lines comprised in the data lines in the zigzag form may be disposed in a link area that is between a pad area and an active area on display panel.

The at least three data lines in the link area may correspond to at least three data lines that are disposed on a single layer in the pad area and at least three data lines that are disposed on a single layer in the active area.

At least one data line of the at least three data lines in the link area may be electrically connected to a corresponding one of the data lines in the pad area and a corresponding one of the data lines in the active area that are disposed on a different layer than said at least one data line, via contact holes disposed to be vertically symmetrical with each other with reference to a virtual horizontal line present in the link area.

In the embodiments of the present disclosure, there is an effect of enabling a display panel to have a narrow bezel by disposing data lines to overlap in groups of at least three, thereby reducing or minimizing an area occupied by a link area. In addition, in the preferred embodiments of the present disclosure, there is an effect of achieving an enhancement in production yield by reducing or minimizing the possibility of disconnection of the data lines and generation of failure such as etching failure or the like caused by an exposure difference at a pattern step when the data lines are disposed to overlap.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

A display device according to an embodiment of the present disclosure may be embodied as a television, an image player, a personal computer (PC), a home theater, a car electric device, a smartphone, etc., without being limited thereto. The display device according to the embodiment of the present disclosure may be embodied as a light emitting display device (LED), a quantum dot display device (QDD), a liquid crystal display device (LCD), etc. For convenience of description, however, the following description will be given in conjunction with an example in which the display device according to the embodiment of the present disclosure is a light emitting display device configured to directly emit light based on an inorganic light emitting diode or an organic light emitting diode.

Figure 1:
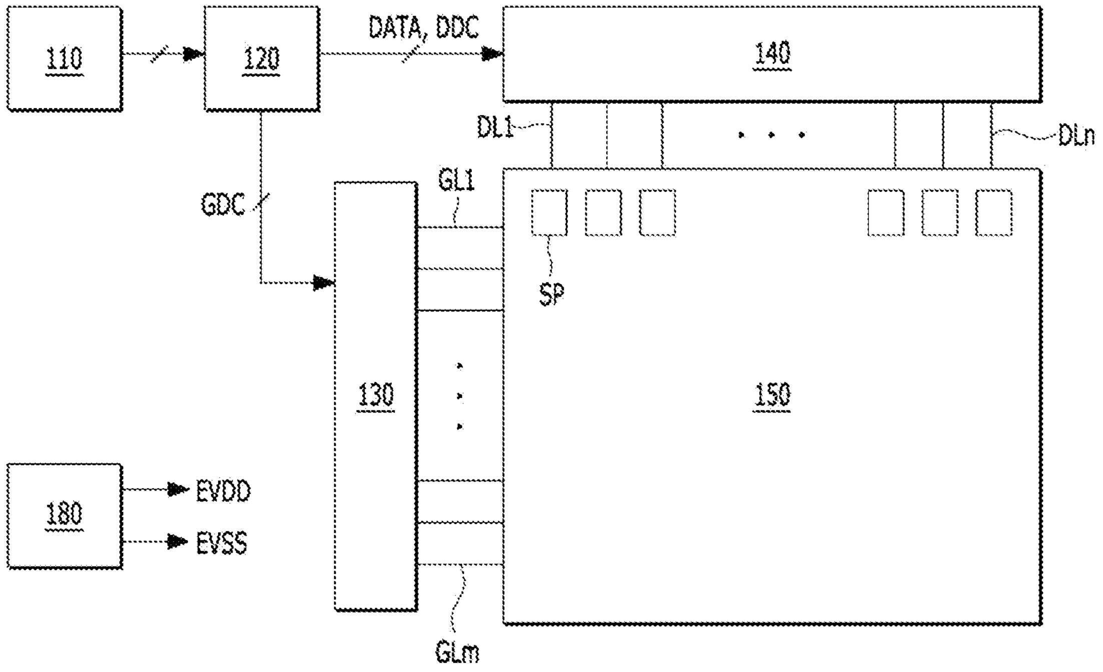
FIG. 1 is a block diagram schematically showing a light emitting display device.
Figure 2:
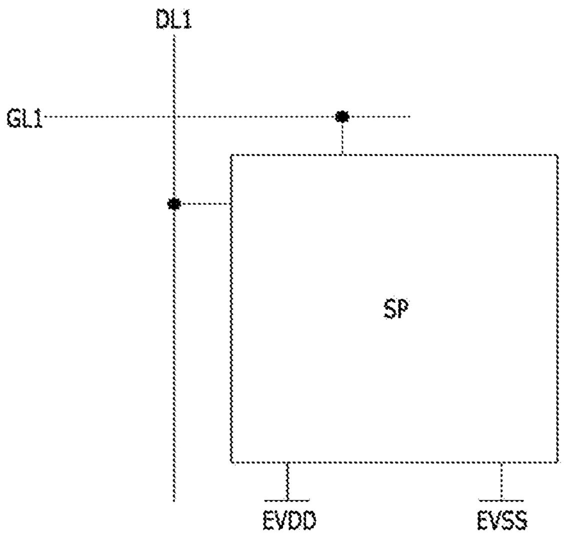
FIG. 2 is a block diagram schematically showing a subpixel shown in FIG. 1.

FIG. 1 is a block diagram schematically showing the light emitting display device. FIG. 2 is a block diagram schematically showing a subpixel shown in FIG. 1.

As shown in FIGS. 1 and 2, the light emitting display device may include an image supplier 110, a timing controller 120, a gate driver (a gate driving circuit) 130, a data driver (a data driving circuit) 140, a display panel 150, a power supply 180, etc.

The image supplier 110 (a set or a host system) may output various drive signals as well as a video data signal (an image data signal) supplied from an exterior thereof or an image data signal stored in an internal memory. The image supplier 110 may supply the data signal and the various drive signals to the timing controller 120.

The timing controller 120 may output a gate timing control signal GDC for control of operation timing of the gate driver 130, a data timing control signal DDC for control of operation timing of the data driver 140, various synchronization signals (a vertical synchronization signal VSYNC and a horizontal synchronization signal HSYNC), etc. The timing controller 120 may supply, to the data driver 140, a data signal DATA supplied from the image supplier 110, together with the data timing control signal DDC. The timing controller 120 may take the form of an integrated circuit (IC) and, as such, may be mounted on a printed circuit board, without being limited thereto.

The gate driver 130 may output a gate signal (or a gate voltage) in response to the gate timing control signal GDC, etc., supplied from the timing controller 120. The gate driver 130 may supply a gate signal to subpixels included in the display panel 150 via gate lines GL1 to GLm. The gate driver 130 may take the form of an IC or may be directly formed on the display panel 150 in the form of a gate-in-panel structure, without being limited thereto.

The data driver 140 may sample and latch the data signal DATA in response to the data timing control signal DDC, etc., supplied from the timing controller 120, may convert a data signal having a digital form into a data voltage having an analog form, based on a gamma reference voltage, and may then output the resultant data voltage. The data driver 140 may supply the data voltage to the subpixels included in the display panel 150 via data lines DL1 to DLn. The data driver 140 may take the form of an IC and, as such, may be mounted on the display panel 150 or a printed circuit board, without being limited thereto.

The power supply 180 may generate a high-level voltage and a low-level voltage based on an external input voltage supplied from an exterior thereof, and may output the high-level voltage and the low-level voltage through a first voltage line EVDD and a second voltage line EVSS. The power supply 180 may generate and output not only the high-level voltage and the low-level voltage, but also a voltage required for driving of the gate driver 130, a voltage required for driving of the data driver 140, etc.

The display panel 150 may display video (an image), corresponding to the drive signal including the gate signal and the data voltage, the drive voltage including the high-level voltage and the low-level voltage, etc. The subpixels of the display panel 150 directly emit light. The display panel 150 may be fabricated based on a substrate having stiffness or ductility, such as glass, silicon, polyimide, or the like. The subpixels, which emit light, may be constituted by red, green and blue subpixels or red, green, blue and white subpixels.

For example, one subpixel SP may be connected to the first data line DL1, the first gate line GL1, the first voltage line EVDD, and the second voltage line EVSS, and may include a pixel circuit constituted by a switching transistor, a driving transistor, a capacitor, an organic light emitting diode, etc. The subpixel SP used in the light emitting display device directly emits light and, as such, the circuit configuration thereof is complex. In addition, a compensation circuit configured to compensate for degradation of not only the organic light emitting diode configured to emit light, but also the driving transistor configured to supply drive current required for driving of the organic light emitting diode, etc., is also diverse. However, in FIG. 2, the subpixel SP is simply shown in the form of a block.

Meanwhile, in the above description, the timing controller 120, the gate driver 130, the data driver 140, etc., have been described as being individual configurations, respectively. However, one or more of the timing controller 120, the gate driver 130, and the data driver 140 may be integrated into one IC in accordance with an implementation type of the light emitting display device.

Figure 3:
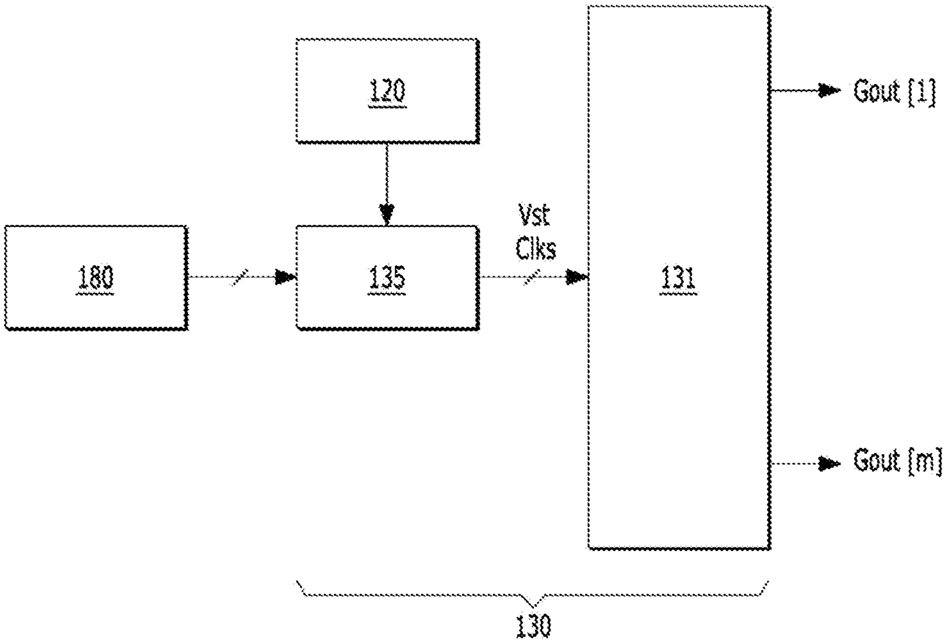
FIGS. 3 and 4 are views explaining a configuration of a gate-in-panel type gate driver.
Figure 4:
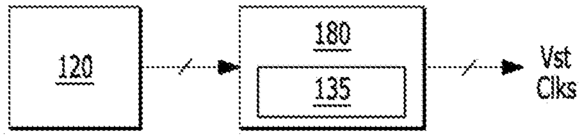
Figure 5:
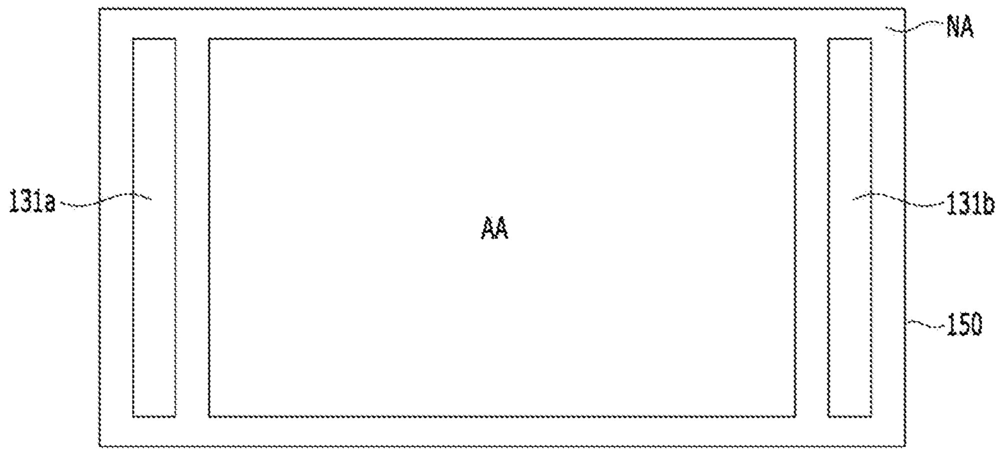
FIG. 5 is a view showing a disposition example of a shift register included in the gate driver.

FIGS. 3 and 4 are views explaining a configuration of a gate-in-panel type gate driver. FIG. 5 is a view showing a disposition example of a shift register included in the gate driver.

As shown in FIG. 3, the gate-in-panel type gate driver, which is designated by reference numeral "130", may include a shift register 131 and a level shifter 135. The level shifter 135 may generate clock signals Clks, a start signal Vst, etc., based on signals and voltages output from a timing controller 120 and a power supply 180. The shift register 131 may operate based on the clock signals Clks, the start signal Vst, etc., output from the level shifter 135, and may output gate signals Gout[1] to Gout[m].

As shown in FIGS. 3 and 4, differently from the shift register 131, the level shifter 135 may be independently formed in the form of an IC or may be included in a power supply 180. Of course, these configurations are only illustrative, and the present disclosure is not limited thereto.

As shown in FIG. 5, in the gate-in-panel type gate driver 130, first and second shift registers 131*a* and 131*b*, which output gate signals, may be disposed in a non-active area NA of a display panel 150. The first and second shift registers 131*a* and 131*b* may be formed on the display panel 150 in the form of a thin film in accordance with a gate-in-panel method. Although the first and second shift registers 131*a* and 131*b* are shown as being disposed in left and right non-active areas NA, respectively, the present disclosure is not limited thereto.

Figure 6:
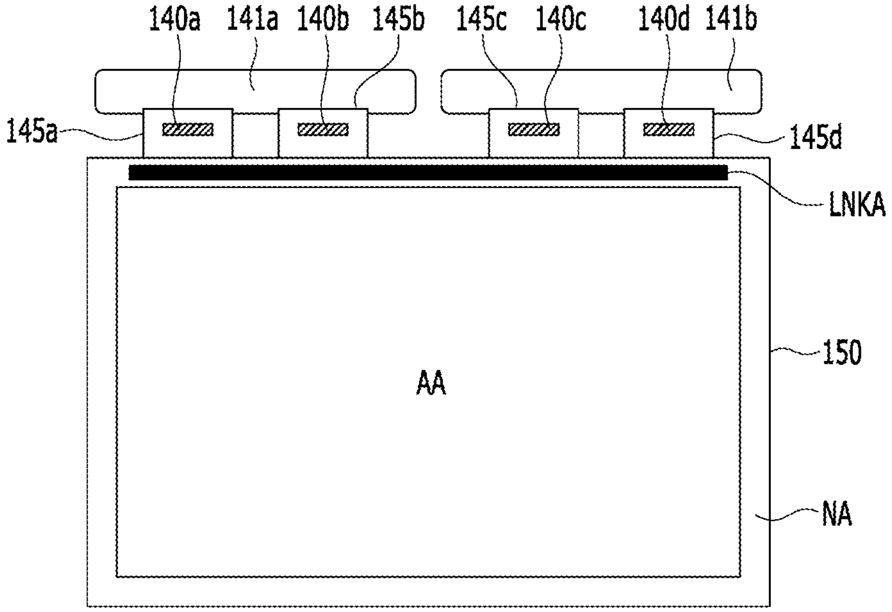
FIG. 6 is a view showing a part of a light emitting display device modularized in accordance with a first embodiment of the present disclosure.
Figure 7:
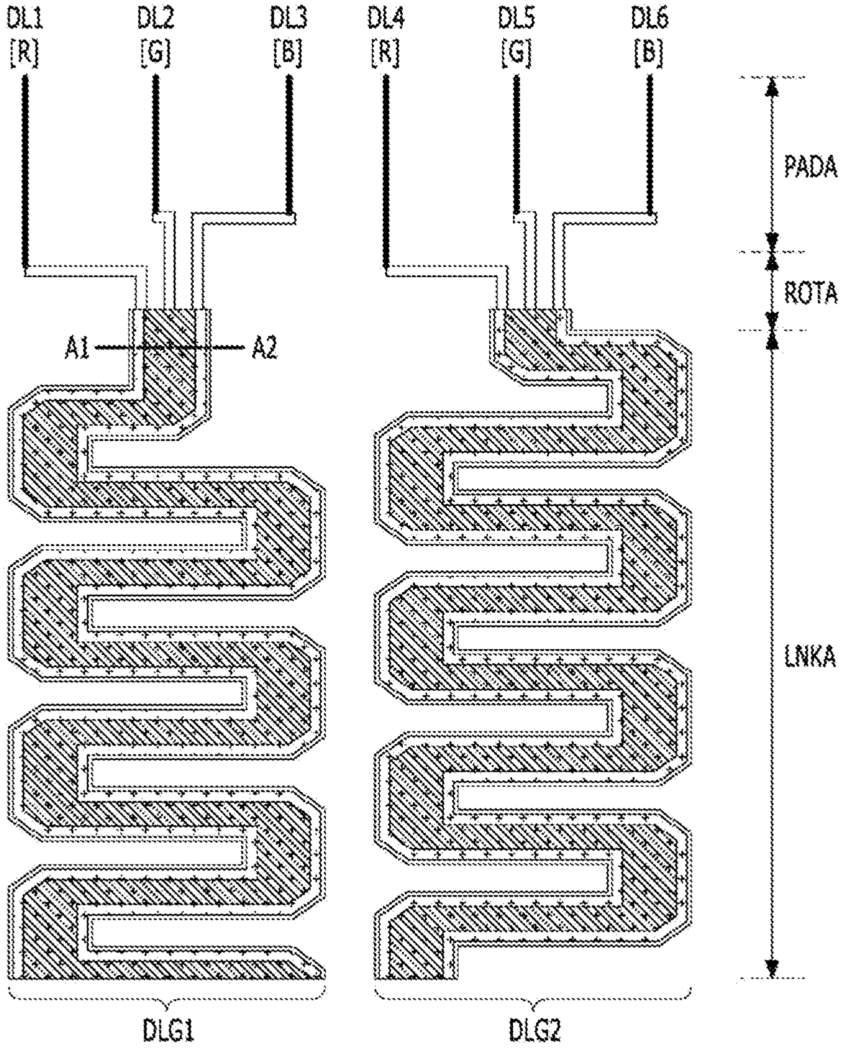
FIG. 7 is a view showing portions of data lines disposed around a link area in FIG. 6 in accordance with the first embodiment of the present disclosure.
Figure 8:
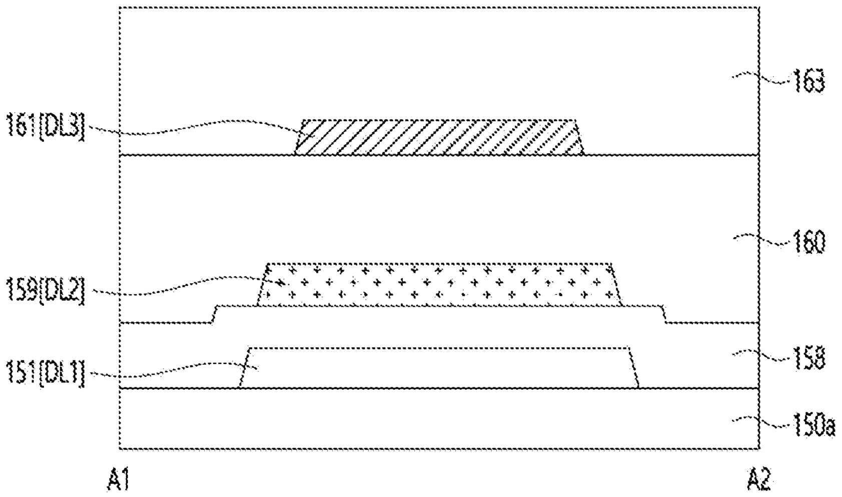
FIG. 8 is a cross-sectional view taken along line A1-A2 in FIG. 7.

FIG. 6 is a view showing a part of a light emitting display device modularized in accordance with a first embodiment of the present disclosure. FIG. 7 is a view showing portions of data lines disposed around a link area in FIG. 6. FIG. 8 is a cross-sectional view taken along line A1-A2 in FIG. 7.

As shown in FIG. 6, data drivers 140*a* to 140*d*, a display panel 150, etc., may be modularized by first circuit boards 145*a* to 145*d*, second circuit boards 141*a* and 141*b*, etc.

The data drivers 140*a* to 140*d* may be mounted on the first circuit boards 145*a* to 145*d*, respectively. It is noted that no scan driver is shown because the scan driver may be formed in a gate-in-panel manner in a non-active area, and no power supply is shown because the mounting position of the power supply may be diverse in accordance with an implementation method of the light emitting display device.

A flexible printed circuit board (FPCB) or the like may be selected for each of the first circuit boards 145*a* to 145*d*, on which the data drivers 140*a* to 140*d* are mounted. Similarly, a flexible printed circuit board (FPCB) or the like may be selected for each of the first one of the second circuit board 141*a*, which is connected to two of the first circuit boards, 145*a* and 145*b*, and the second one of the second circuit board 141*b*, which is connected to the other two of the first circuit boards, 145*c* and 145*d*.

FIG. 6 shows an example in which the display panel 150 is modularized by the four data drivers 140*a* to 140*d*, the four first circuit boards 145*a* to 145*d*, and the two second circuit boards 141*a* and 141*b* in accordance with the first embodiment of the present disclosure. However, the module shown in FIG. 6 is only illustrative, and modularization of the display panel 150 may be varied in accordance with an implementation method of the light emitting display device or a size (or a resolution) of the display panel 150.

As shown in FIGS. 6 and 7, a pad area PADA, a routing area ROTA, a link area LNKA, etc., may be disposed between the data drivers 140*a* to 140*d* and an active area AA. The pad area PADA may be defined as an area in which pads included in the first circuit boards 145*a* to 145*d* and pads included in the display panel 150 are electrically interconnected. The link area LNKA may be defined as an area in which lines configured to transmit signals to the display panel 150, such as data lines DL1 to DL6, are disposed to form a multilayer structure. The routing area ROTA may be defined as an area assisting in contact between lines disposed on different layers, among the data lines DL1 to DL6 connected to the pad area PADA, when the data lines DL1 to DL6 extend to the link area LNKA, etc., for electrical interconnection of the lines.

As shown in FIG. 7, in accordance with the first embodiment of the present disclosure, the data lines DL1 to DL6 may be disposed not to overlap in the pad area PADA and the routing area ROTA, but may be disposed to overlap in groups of at least three in the link area LNKA. When the data lines DL1 to DL6 are disposed in the link area LNKA such that the data lines DL1 to DL6 overlap in groups of at least three, an area occupied by the link area LNKA may be reduced or minimized and, as such, the display panel may have a narrow bezel.

For example, the first to third data lines DL1 to DL3 included in three adjacent ones of the data lines DL1 to DL6 may be disposed to form a single layer in the pad area PADA and the routing area ROTA, but may then be disposed to form plural layers in the link area LNKA such that the first to third data lines DL1 to DL3 overlap vertically.

In addition, the fourth to sixth data lines DL4 to DL6 included in three adjacent ones of the data lines DL1 to DL6 may be disposed to form a single layer in the pad area PADA and the routing area ROTA, but may then be disposed to form plural layers in the link area LNKA such that the fourth to sixth data lines DL4 to DL6 overlap vertically.

The first to third data lines DL1 to DL3, which overlap in a first area of the link area LNKA, may be defined as a first data line group DLG1, and the fourth to sixth data lines DL4 to DL6, which overlap in a second area of the link area LNKA, may be defined as a second data line group DLG2.

Each of the first data line group DLG1, the second data line group DLG2, etc., may be disposed in a zigzag form in the link area LNKA, taking into consideration a resistance deviation problem caused by length differences among lines (this is because a picture quality defect such as display mura or the like may be generated due to a data voltage deviation when there is a severe resistance deviation). In the pad area PADA and the routing area ROTA other than the link area LNKA, however, the data lines DL1 to DL6, which do not overlap, may be disposed in a straight form or an oblique form.

Meanwhile, FIG. 7 shows an example in which each of the first data line DL1 and the fourth data line DL4 is a red data line [R] configured to transmit a data voltage for driving of a red subpixel, each of the second data line DL2 and the fifth data line DL5 is a green data line [G] configured to transmit a data voltage for driving of a green subpixel, and each of the third data line DL3 and the sixth data line DL6 is a blue data line [B] configured to transmit a data voltage for driving of a blue subpixel. However, when a white subpixel or a subpixel of another color is disposed at the display panel, a data line configured to transmit a data voltage for driving the subpixel may be added. That is, FIG. 7 is only illustrative, and disposition order and number of data lines on a plane are not limited to the above-described conditions.

As shown in FIGS. 7 and 8, the first to third data lines DL1 to DL3, which have an overlap relation in the first area of the link area LNKA, may be disposed on different layers, respectively, under the condition that at least one insulating layer is interposed thereamong.

For example, the first data line DL1 may be formed using a first metal layer 151 disposed on a substrate 150*a*. The second data line DL2 may be formed using a second metal layer 159 disposed on a lower insulating layer 158 covering the first data line DL1. The third data line DL3 may be formed using a third metal layer 161 disposed on a middle insulating layer 160 covering the second data line DL2. An upper insulating layer 163 may be disposed on the third metal layer 161 selected as the third data line DL3.

Meanwhile, FIG. 8 shows an example in which the first data line DL1 is disposed on a lower layer disposed at a lowest level, the third data line DL3 is disposed on an upper layer disposed at a highest level, and the second data line DL2 is disposed on a middle layer disposed between the lower layer and the upper layer. However, FIG. 8 is only illustrative, and disposition order of the data lines in cross-section is not limited thereto.

Figure 9:
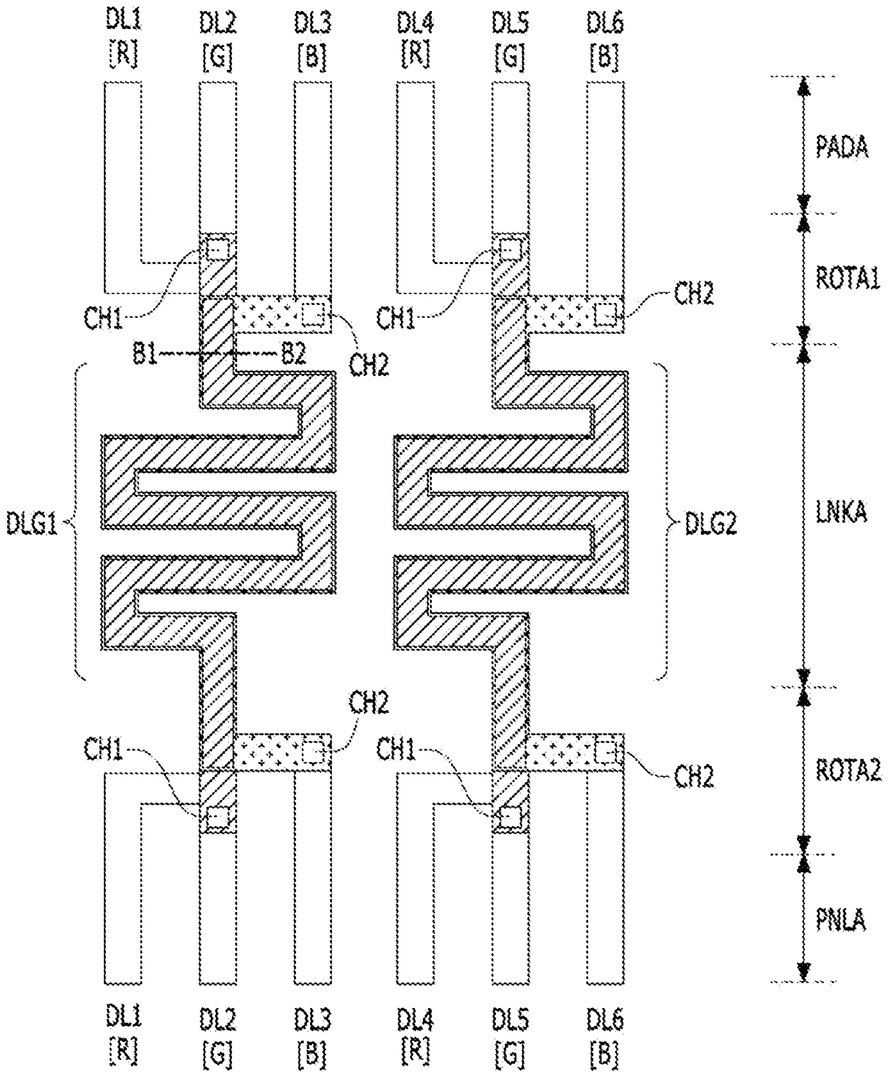
FIG. 9 is a view showing portions of data lines disposed around the link area of FIG. 6 in accordance with a second embodiment of the present disclosure.
Figure 10:
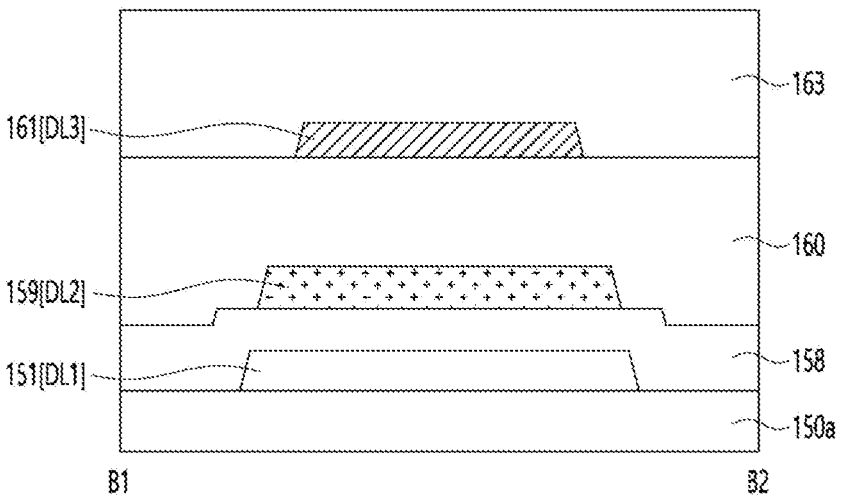
FIG. 10 is a cross-sectional view taken along line B1-B2 in FIG. 9.
Figure 11:
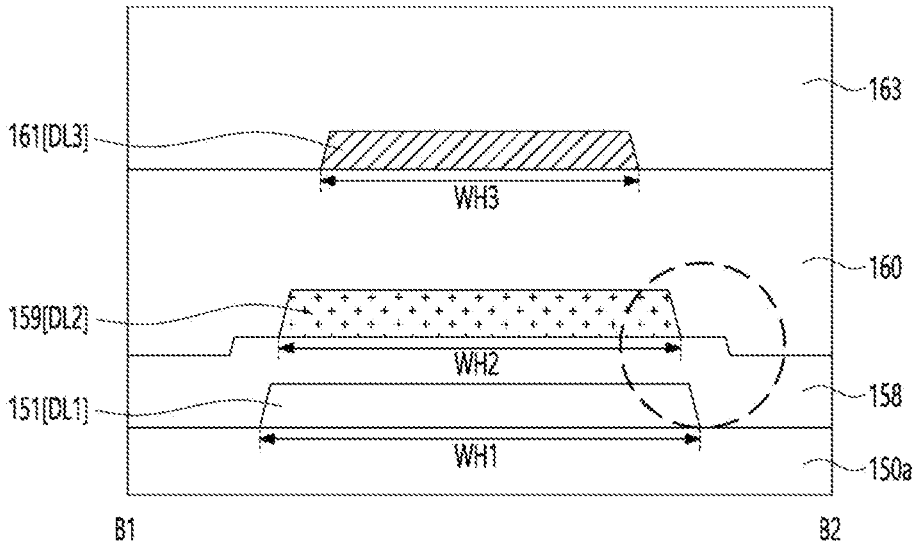
FIGS. 11 and 12 are illustrative cross-sectional views explaining portions, associated with line widths, of the data lines disposed in the link area.
Figure 12:
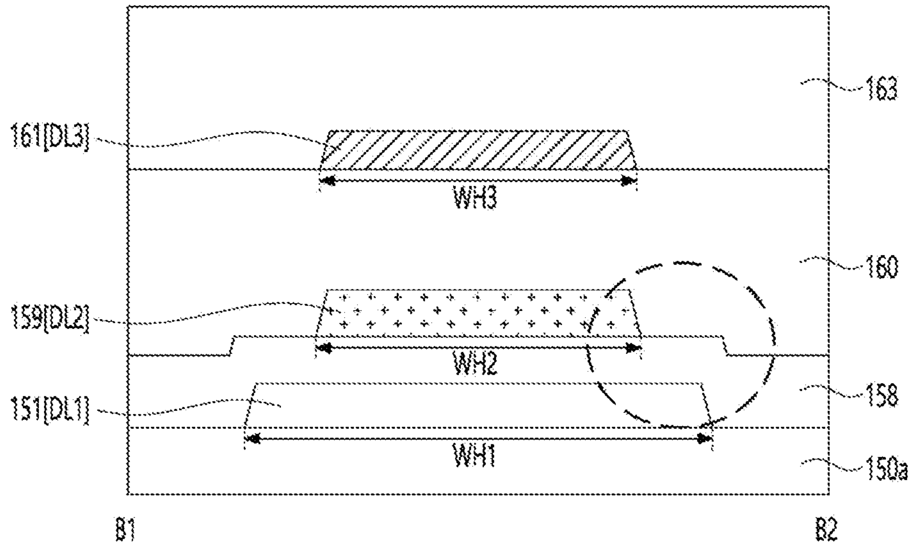

FIG. 9 is a view showing portions of data lines disposed around the link area of FIG. 6 in accordance with a second embodiment of the present disclosure. FIG. 10 is a cross-sectional view taken along line B1-B2 in FIG. 9. FIGS. 11 and 12 are illustrative cross-sectional views explaining portions, associated with line widths, of the data lines disposed in the link area.

As shown in FIGS. 9 and 10, in accordance with the second embodiment of the present disclosure, data lines DL1 to DL6 may be disposed not to overlap in a pad area PADA and a routing area ROTA, but may be disposed to overlap in groups of at least three in the link area LNKA.

A first data line group DLG1 including the first to third data lines DL1 to DL3, which overlap in a first area of the link area LNKA, and a second data line group DLG2 including the fourth to sixth data lines DL4 to DL6, which overlap in a second area of the link area LNKA, may have the same disposition structures in plan view as those of the first embodiment, respectively.

Accordingly, the first data line DL1 may be formed using a first metal layer 151 disposed on a substrate 150*a*. The second data line DL2 may be formed using a second metal layer 159 disposed on a first insulating layer 158 covering the first data line DL1. The third data line DL3 may be formed using a third metal layer 161 disposed on a second insulating layer 160 covering the second data line DL2.

A first contact hole CH1 and a second contact hole CH2 may be disposed in a first routing area ROTA1 between the pad area PADA and the link area LNKA and a second routing area ROTA2 between the link area LNKA and a panel active area PNLA (or an active area), respectively.

The first data line DL1 included in the first data line group DLG1 and the fourth data line DL4 included in the second data line group DLG2 are continuously disposed on a lower layer in an area extending from the pad area PADA to the panel active area PNLA and, as such, may not require a contact structure for electrical connection such as the first contact hole CH1 or the second contact hole CH2.

However, the second and third data lines DL2 and DL3 included in the first data line group DLG1 are disposed on a middle layer and an upper layer, respectively, and the fifth and sixth data lines DL5 and DL6 included in the second data line group DLG2 are disposed on the middle layer and the upper layer, respectively, and, as such, the second and third data lines DL2 and DL3 and the fifth and sixth data lines DL5 and DL6 may require a contact structure for electrical connection such as the first contact hole CH1 or the second contact hole CH2.

Although the second data line DL2 included in the first data line group DLG1 and the fifth data line DL5 included in the second data line group DLG2 are disposed on the lower layer in the pad area PADA and the panel active area PNLA, layer positions thereof are changed to the middle layer in the link area LNKA. As a result, the first contact hole CH1 for electrical connection between the lower layer and the middle layer may be included.

In this case, the first contact hole CH1 included in the first routing area ROTA1 and the first contact hole CH1 included in the second routing area ROTA2 may be disposed on the same vertical line. In other words, the first contact holes CH1 may be disposed to be vertically symmetrical with each other with reference to a virtual horizontal line present in the link area LNKA.

Although the third data line DL3 included in the first data line group DLG1 and the sixth data line DL6 included in the second data line group DLG2 are disposed on the lower layer in the pad area PADA and the panel active area PNLA, layer positions thereof are changed to the upper layer in the link area LNKA. As a result, the second contact hole CH2 for electrical connection between the lower layer and the upper layer may be included.

In this case, the second contact hole CH2 included in the first routing area ROTA1 and the second contact hole CH2 included in the second routing area ROTA2 may be disposed on the same vertical line. In other words, the second contact holes CH2 may be disposed to be vertically symmetrical with each other with reference to a virtual horizontal line present in the link area LNKA. Meanwhile, each second contact hole CH2 may have a greater area than that of each first contact hole CH1 because the second contact hole CH2 provides a path for interconnecting the data line on the lower layer and the data line on the upper layer.

Meanwhile, when the data lines are disposed based on the above-described structures, the first routing area ROTA1 and the second routing area ROTA2 may be formed to a level of 10 to 20 μm. In addition, the link area LNKA may be formed to a level of 1,000 μm lowered from a level of 2,500 μm in conventional cases. In addition, it may be possible to reduce or minimize the area occupied by the routing area in accordance with formation of the contact holes CH1 and CH2 having a symmetrical relation between the first routing area ROTA1 and the second routing area ROTA2.

In a first example shown in FIG. 11, a line width WH1 of the first data line DL1 disposed on the lower layer, a line width WH2 of the second data line DL2 disposed on the middle layer, and a line width WH3 of the third data line DL3 disposed on the upper layer may have a relation of WH1>WH2>WH3. In a second example shown in FIG. 12, a line width WH1 of the first data line DL1 disposed on the lower layer, a line width WH2 of the second data line DL2 disposed on the middle layer, and a line width WH3 of the third data line DL3 disposed on the upper layer may have a relation of WH1>WH2=WH3 or WH1>WH2=WH3.

When the line width WH1 of the first data line DL1 disposed on the lower layer is wider (greater) than the line width WH2 of the second data line DL2 disposed on the middle layer and the line width WH3 of the third data line DL3 disposed on the upper layer, it may be possible to reduce or minimize the possibility of generation of step exposure failure.

Step exposure failure may mean that an exposure difference (exposure failure) is generated at an insulating layer, etc., disposed between a lower-layer structure and a middle-layer structure disposed thereover when line widths of the lower-layer structure and the middle-layer structure are similar or equal to each other, as can be seen from a circle indicated by a dotted line in FIG. 11. Accordingly, when the line widths are configured to have conditions shown in FIGS. 11 and 12, the data lines DL1 to DL3 are formed to overlap completely inside a pattern and, as such, it may be possible to reduce or minimize the possibility of disconnection of the data lines DL1 to DL3 and generation of failure such as etching failure or the like caused by an exposure difference at a pattern step, thereby achieving an enhancement in production yield.

Hereinafter, a configuration, a layout, and a cross-section of a subpixel will be shown, and which layer includes a metal layer, by which the above-described data lines are formed to overlap in a link area, will be illustrated and described.

Figure 13:
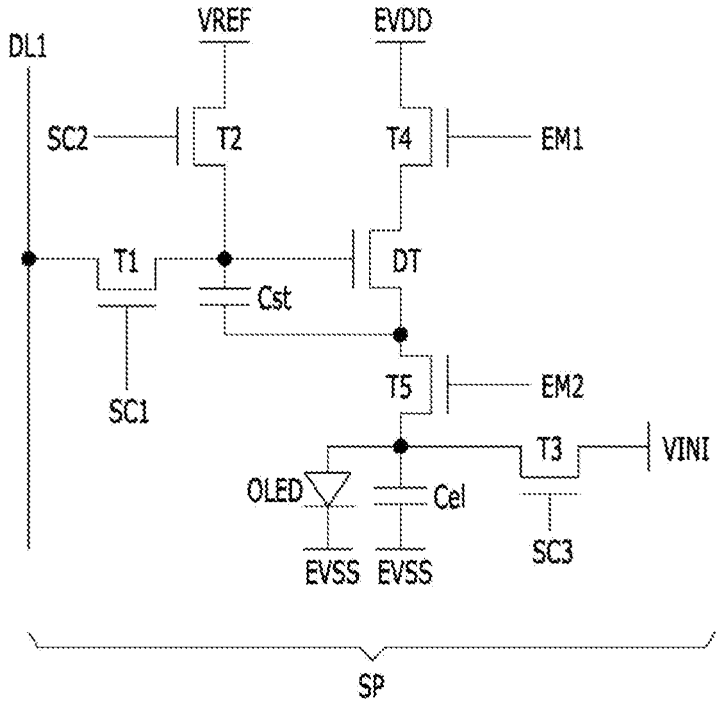
FIG. 13 is a circuit diagram showing a configuration of a subpixel according to a third embodiment of the present disclosure.
Figure 14:
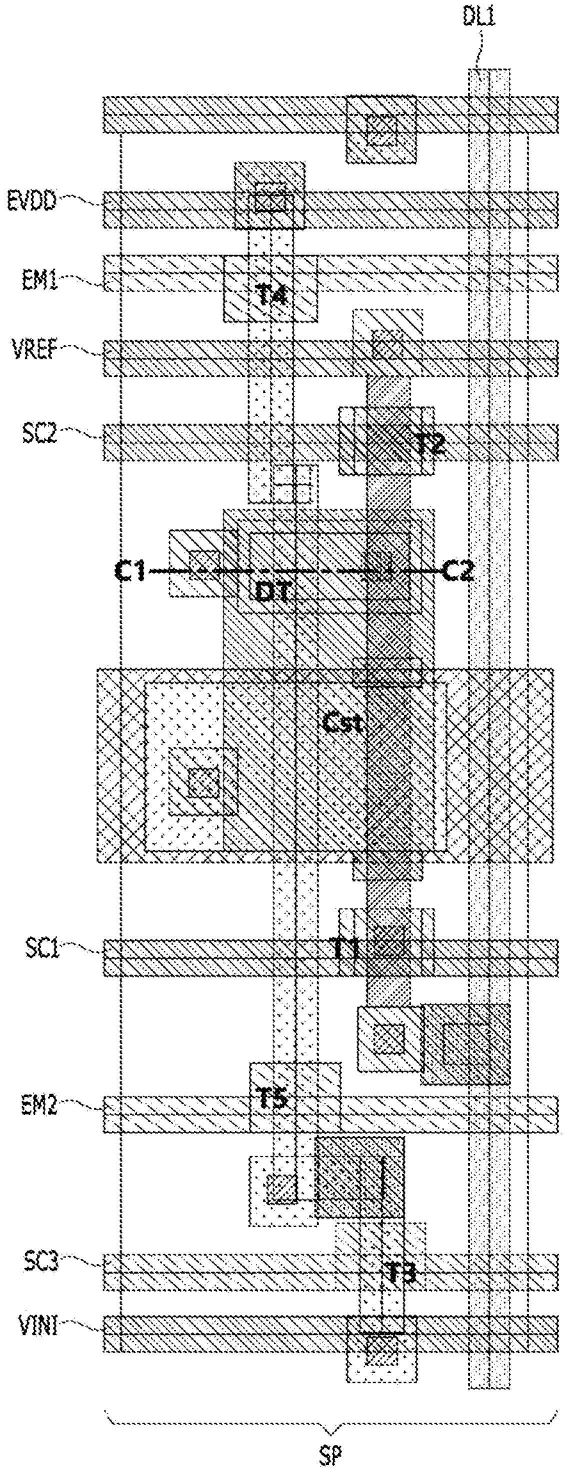
FIG. 14 is a layout of the subpixel shown in FIG. 13.
Figure 15:
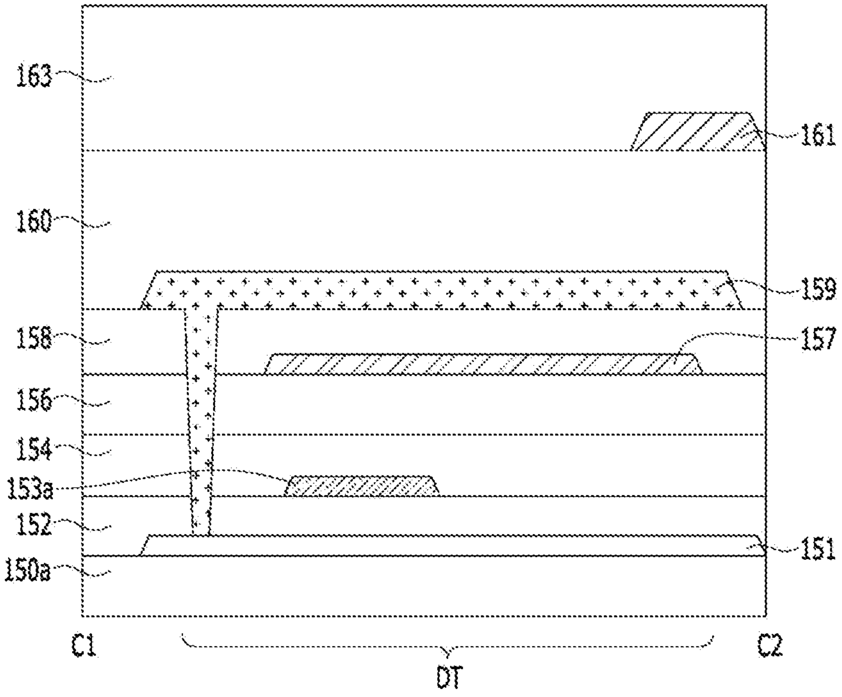
FIG. 15 is a cross-sectional view taken along line C1-C2 in FIG. 14.
Figure 16:
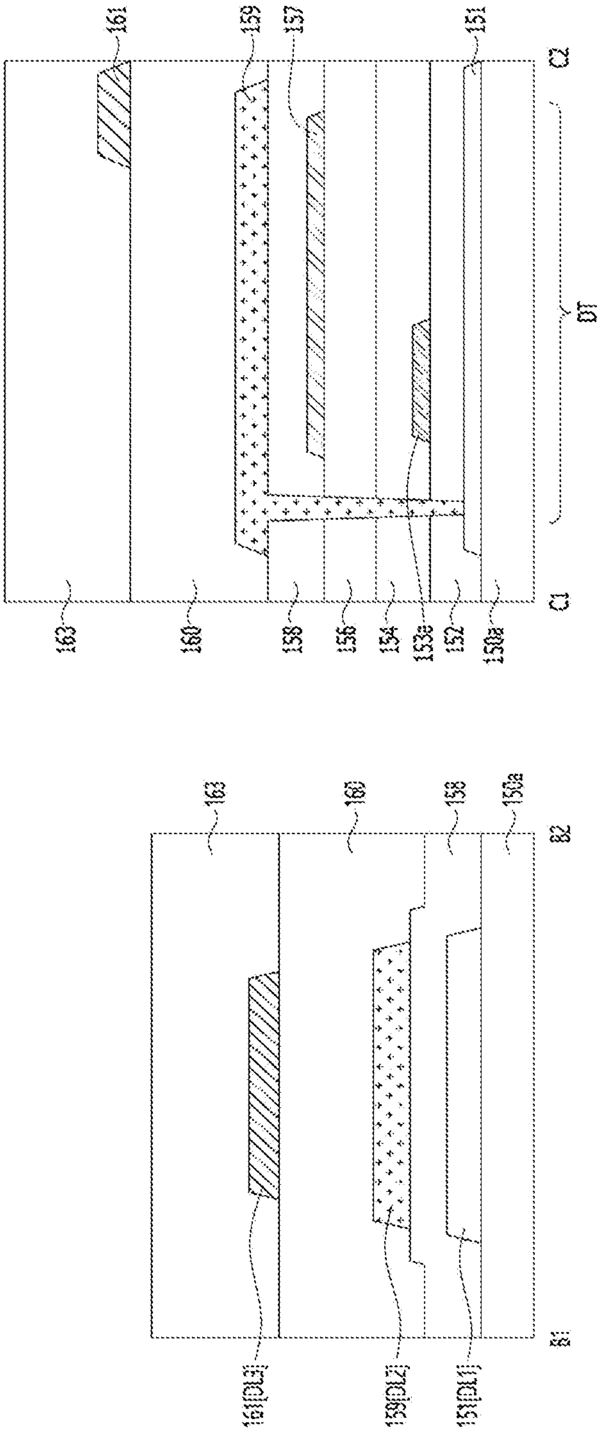
FIG. 16 is a view explaining layers constituting data lines, based on a cross-section in FIG. 10 and a cross-section in FIG. 15.

FIG. 13 is a circuit diagram showing a configuration of a subpixel according to a third embodiment of the present disclosure. FIG. 14 is a layout of the subpixel shown in FIG. 13. FIG. 15 is a cross-sectional view taken along line C1-C2 in FIG. 14. FIG. 16 is a view explaining layers constituting data lines, based on a cross-section in FIG. 10 and a cross-section in FIG. 15.

As shown in FIG. 13, in accordance with the third embodiment of the present disclosure, a subpixel SP may include a first transistor T1, a second transistor T2, a third transistor T3, a fourth transistor T4, a fifth transistor T5, a driving transistor DT, a capacitor Cst, a parasitic capacitor Cel, and an organic light emitting diode OLED.

The first transistor T1 may be connected, at a gate electrode thereof, to a first scan signal line SC1, may be connected, at a first electrode thereof, to a first data line DL1, and may be connected, at a second electrode thereof, to a gate node including a first electrode of a capacitor Cst and a second electrode of the second transistor T2. The first transistor T1 may transmit, to the gate node, a data voltage applied thereto through the first data line DL1, in response to a first scan signal applied thereto through the first scan signal line SC1.

The second transistor T2 may be connected, at a gate electrode thereof, to a second scan signal line SC2, may be connected, at a first electrode thereof, to a reference line VREF, and may be connected, at a second electrode thereof, to a gate node including a gate electrode of the driving transistor DT, etc. The second transistor T2 may transmit, to the gate node, a reference voltage applied thereto through the reference line VREF, in response to a second scan signal applied thereto through the second scan signal line SC2.

The third transistor T3 may be connected, at a gate electrode thereof, to a third scan signal line SC3, may be connected, at a first electrode thereof, to an initialization voltage line VIN1, and may be connected, at a second electrode thereof, to an initialization node including a second electrode of the fifth transistor T5, a first electrode of the parasitic capacitor Cel, and an anode of the organic light emitting diode OLED. The third transistor T3 may transmit, to the anode of the organic light emitting diode OLED, an initialization voltage applied thereto through the initialization voltage line VIN1, in response to a third scan signal applied thereto through the third scan signal line SC3.

The fourth transistor T4 may be connected, at a gate electrode thereof, to a first emission signal line EM1, may be connected, at a first electrode thereof, to a first voltage line EVDD, and may be connected, at a second electrode thereof, to a first electrode of the driving transistor DT. The fourth transistor T4 may transmit, to the first electrode of the driving transistor DT, a high-level voltage applied thereto through the first voltage line EVDD, in response to a first emission signal applied thereto through the first emission signal line EM1.

The fifth transistor T5 may be connected, at a gate electrode thereof, to a second emission signal line EM2, may be connected, at a first electrode thereof, to a source node including a second electrode of the capacitor Cst and a second electrode of the driving transistor DT, and may be connected, at a second electrode thereof, to the initialization node including the anode of the organic light emitting diode OLED. The fifth transistor T5 may transmit, to the anode of the organic light emitting diode OLED, drive current generated from the driving transistor DT, in response to a second emission signal applied thereto through the second emission signal line EM2.

The driving transistor DT may be connected, at the gate electrode thereof, to the gate node including the first electrode of the capacitor Cst, etc., may be connected, at the first electrode thereof, to the second electrode of the fourth transistor T4, and may be connected, at the second electrode thereof, to the source node including the second electrode of the capacitor Cst, etc. The driving transistor DT may generate drive current based on a data voltage stored in the capacitor Cst.

The capacitor Cst may be connected, at a first electrode thereof, to the gate node including the gate electrode of the driving transistor DT, and may be connected, at a second electrode thereof, to the source node including the second electrode of the driving transistor DT. The capacitor Cst may transmit a data voltage stored therein to the gate electrode of the driving transistor DT.

The parasitic capacitor Cel may be connected, at the first electrode thereof, to the initialization node including the anode of the organic light emitting diode OLED, and may be connected, at a second electrode thereof, to a second voltage line EVSS. Although not shown, the parasitic capacitor Cel may be present at both ends of the organic light emitting diode OLED.

The organic light emitting diode OLED may be connected, at the anode thereof, to the initialization node including the second electrode of the fifth transistor T5, etc., and may be connected, at a cathode thereof, to the second voltage line EVSS. The organic light emitting diode OLED may emit light based on drive current provided in accordance with turn-on operations of the fourth transistor T4, the driving transistor DT and the fifth transistor T5.

As shown in FIG. 14, in accordance with the third embodiment of the present disclosure, the first data line DL1 may be disposed in a first direction (a vertical direction) of the subpixel SP. The first voltage line EVDD, the first emission signal line EM1, the reference line VREF, the second scan signal line SC2, the first scan signal line SC1, the second emission signal line EM2, the third scan signal line SC3, and the initialization voltage line VIN1 may be disposed in a second direction (a horizontal direction) of the subpixel SP in this order from an upper side (an upper side in FIG. 14) to a lower side.

The fourth transistor T4 may be disposed, corresponding to the first emission signal line EM1 extending between the first voltage line EVDD and the reference line VREF. The second transistor T2 may be disposed, corresponding to the second scan signal line SC2 extending between the reference line VREF and the driving transistor DT.

The driving transistor DT may be disposed between the second scan signal line SC2 and the capacitor Cst. The capacitor Cst may be disposed between the driving transistor DT and the first scan signal line SC1.

The first transistor T1 may be disposed, corresponding to the first scan signal line SC1 extending between the capacitor Cst and the second emission signal line EM2. The fifth transistor T5 may be disposed, corresponding to the second emission signal line EM2 extending between the first scan signal line SC1 and the third scan signal line SC3.

The third transistor T3 may be disposed, corresponding to the third scan signal line SC3 extending between the second emission signal line EM2 and the initialization voltage line VIN1. The initialization voltage line VIN1 may be disposed at a lowermost end of the subpixel SP.

As shown in FIG. 15, a light shielding metal layer 151 may be disposed on a first substrate 150*a*. The light shielding metal layer 151 may function to prevent incidence of external light through the first substrate 150*a*. A buffer layer 152 covering the light shielding metal layer 151 may be disposed on the first substrate 150*a*.

A semiconductor layer 153*a* may be disposed on the buffer layer 152. The semiconductor layer 153*a* may be formed using an oxide. The semiconductor layer 153*a* may become an active layer of the driving transistor DT. A first insulating layer 154 covering the semiconductor layer 153*a* may be disposed on the buffer layer 152.

A second insulating layer 156 may be disposed on the first insulating layer 154. A gate metal layer 157 may be disposed on the second insulating layer 156. The gate metal layer 157 may become the gate electrode of the driving transistor DT. A third insulating layer 158 covering the gate metal layer 157 may be disposed on the second insulting layer 156.

A first source/drain metal layer 159 may be disposed on the third insulating layer 158. The first source/drain metal layer 159 may become a source electrode or a drain electrode of the driving transistor DT. A first planarization layer 160 covering the first source/drain metal layer 159 may be disposed on the third insulating layer 158.

A second source/drain metal layer 161 may be disposed on the first planarization layer 160. A second planarization layer 163 covering the second source/drain metal layer 161 may be disposed on the first planarization layer 160.

As shown in FIG. 16, a stack structure of the driving transistor DT included in the subpixel is defined as a representative interlayer structure included in an active area. Hereinafter, stack relations of the data lines DL1 to DL3 included in a link area will be described based on the representative interlayer structure. However, unlike the subpixel area, the link area will be described based on the fact that some components (e.g., the buffer layer 152 to the gate metal layer 157) do not exist. This is because, unlike the sub-pixel area, the link area uses relatively few layers, so unused layers are removed to increase process stability and efficiency.

Among the data lines DL1 to DL3 included in the link area, the first metal layer 151 constituting the first data line DL1 may be a layer formed and patterned identically to the light shielding metal layer 151 included in the active area. The lower insulating layer 158 included in the link area may be a layer formed and patterned identically to the third insulating layer 158 included in the active area.

Among the data lines DL1 to DL3 included in the link area, the second metal layer 159 constituting the second data line DL2 may be a layer formed and patterned identically to the first source/drain metal layer 159 included in the active area. The middle insulating layer 160 included in the link area may be a layer formed and patterned identically to the first planarization layer 160 included in the active area.

Among the data lines DL1 to DL3 included in the link area, the third metal layer 161 constituting the third data line DL3 may be a layer formed and patterned identically to the second source/drain metal layer 161 included in the active area. The upper insulating layer 163 included in the link area may be a layer formed and patterned identically to the second planarization layer 163 included in the active area.

Meanwhile, the above-described structure of the subpixel is only illustrative for explanation of an overlap structure of the data lines according to embodiments of the present disclosure. In this regard, an overlap structure of the data lines according to embodiments of the present disclosure may be implemented based on various subpixel structures. In addition, although the embodiments of the present disclosure have been described with reference to a specific area that is the link area, this is only illustrative. The embodiments of the present disclosure may be applied to an area in which overlap design of data lines is required.

As apparent from the above description, in the embodiments of the present disclosure, there is an effect of enabling a display panel to have a narrow bezel by disposing data lines to overlap in groups of at least three, thereby reducing or minimizing an area occupied by a link area. In addition, in the preferred embodiments of the present disclosure, there is an effect of achieving an enhancement in production yield by reducing or minimizing the possibility of disconnection of the data lines and generation of failure such as etching failure or the like caused by an exposure difference at a pattern step when the data lines are disposed to overlap.

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a substrate having thereon an active area, a pad area adjacent to the active area, and a link area between the active area and the pad area; and data lines disposed to extend from the pad area to the active area, wherein at least three of the data lines are disposed on a single layer in the pad area and on a single layer in the active area, and wherein the same at least three data lines extend in parallel through the link area and overlap each other on different layers in a plan view while extending between the pad area and the active area.

2. The display device according to claim 1, wherein a first data line of the at least three data lines disposed on a lower layer includes a light shielding metal layer disposed on the substrate.

3. The display device according to claim 2, wherein a second data line of the at least three data lines disposed on a middle layer includes a first source/drain metal layer disposed on a lower insulating layer covering the light shielding metal layer, and wherein the middle layer is above the lower layer.

4. The display device according to claim 3, wherein a third data line of the at least three data lines disposed on an upper layer includes a second source/drain metal layer disposed on a middle insulating layer covering the first source/drain metal layer, and wherein the upper layer is above the middle layer.

5. The display device according to claim 4, wherein the first data line has a greater line width than at least one of a line width of the second data line or a line width of the third data line.

6. The display device according to claim 2, wherein a second one of the at least three data lines disposed on a middle layer is formed using a first source/drain metal layer disposed on a lower insulating layer covering the light shielding metal layer.

7. The display device according to claim 3, wherein a third one of the at least three data lines disposed on an upper layer is formed using a second source/drain metal layer disposed on a middle insulating layer covering the first source/drain metal layer.

8. The display device according to claim 1, comprising a first routing area between the pad area and the link area;

a second routing area between the link area and the active area;

a first contact hole comprised in the first routing area; and a second contact hole comprised in the second routing area are disposed to be vertically symmetrical with each other with reference to a virtual horizontal line present in the link area.

9. The display device according to claim 1, wherein a first one of the at least three data lines disposed on a lower layer is formed using a light shielding metal layer disposed on the substrate.

10. A display device, comprising:

a display panel having an active area, a pad area adjacent to the active area, and a link area between the active area and the pad area; and data lines disposed on the display panel, the data lines including a first data line, a second data line, and a third data line, wherein the data lines comprise data lines disposed in a zigzag form, wherein the first, second, and third data lines are disposed on a single layer in the pad area and on a single layer in the active area of the display panel, and wherein the same first, second, and third data lines extend in parallel through the link area between the pad area and the active area and overlap each other on different layers in a plan view.

11. The display device according to claim 10, wherein:

the first data line of the at least three data lines disposed on a lower layer includes a light shielding metal layer disposed on a substrate;

the second data line of the at least three data lines disposed on a middle layer includes a first source/drain metal layer disposed on a lower insulating layer covering the light shielding metal layer; and the third data line of the at least three data lines disposed on an upper layer includes a second source/drain metal layer disposed on a middle insulating layer covering the first source/drain metal layer, wherein the middle layer is above the lower layer, and wherein the upper layer is above the middle layer.

12. The display device according to claim 11, wherein the first data line has a greater line width than at least one of a line width of the second data line or a line width of the third data line.

13. The display device according to claim 10, wherein the at least three data lines comprised in the data lines in the zigzag form are disposed in a link area that is between a pad area and an active area on display panel.

14. The display device according to claim 13, wherein the at least three data lines in the link area correspond to at least three data lines that are disposed on a single layer in the pad area and at least three data lines that are disposed on a single layer in the active area.

15. The display device according to claim 14, wherein at least one data line of the at least three data lines in the link area is electrically connected to a corresponding one of the data lines in the pad area and a corresponding one of the data lines in the active area that are disposed on a different layer than the at least one data line, via contact holes disposed to be vertically symmetrical with each other with reference to a virtual horizontal line present in the link area.

16. The display device according to claim 10, wherein:

the first data line of the at least three data lines disposed on a lower layer is formed using a light shielding metal layer disposed on a substrate;

the second data line of the at least three data lines disposed on a middle layer is formed using a first source/drain metal layer disposed on a lower insulating layer covering the light shielding metal layer; and the third data line of the at least three data lines disposed on an upper layer is formed using a second source/drain metal layer disposed on a middle insulating layer covering the first source/drain metal layer, wherein the middle layer is above the lower layer, and wherein the upper layer is above the middle layer.

17. A display device, comprising:

a substrate having thereon an active area, a pad area adjacent to the active area, and a link area between the active area and the pad area; and data lines disposed to extend from the pad area to the active area, wherein at least three of the data lines extend continuously from the pad area to the active area, and wherein the same at least three data lines are disposed on different layer and overlap each other in a plan view only while extending through the link area between the pad area and the active area.

18. The display device according to claim 17, wherein a first data line of the at least three data lines disposed on a lower layer includes a light shielding metal layer disposed on the substrate.

19. The display device according to claim 18, wherein a second data line of the at least three data lines disposed on a middle layer includes a first source/drain metal layer disposed on a lower insulating layer covering the light shielding metal layer, and wherein the middle layer is above the lower layer.

20. The display device according to claim 19, wherein a third data line of the at least three data lines disposed on an upper layer includes a second source/drain metal layer disposed on a middle insulating layer covering the first source/drain metal layer, and wherein the upper layer is above the middle layer, and wherein the first data line has a greater line width than at least one of a line width of the second data line or a line width of the third data line.

* * * * *